(12) United States Patent  (10) Patent No.: US 9,077,292 B2
Haruna et al.  (45) Date of Patent: Jul. 7, 2015

(54) POWER AMPLIFIER

(71) Applicant: Mitsubishi Electric Corporation, Tokyo (JP)

(72) Inventors: Takao Haruna, Tokyo (JP); Yoshinobu Sasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 53 days.

(21) Appl. No.: 13/975,418

(22) Filed: Aug. 26, 2013

(65) Prior Publication Data

US 2014/0167853 A1 Jun. 19, 2014

(30) Foreign Application Priority Data

Dec. 19, 2012 (JP) ................. 2012-277202

(51) Int. Cl.
*H03F 1/14* (2006.01)
*H03F 3/21* (2006.01)
*H03F 1/02* (2006.01)
*H03F 3/24* (2006.01)
*H03F 3/72* (2006.01)

(52) U.S. Cl.
CPC .............. *H03F 3/211* (2013.01); *H03F 1/0277* (2013.01); *H03F 3/24* (2013.01); *H03F 3/72* (2013.01); *H03F 2203/21175* (2013.01); *H03F 2203/7221* (2013.01); *H03F 2203/7233* (2013.01)

(58) Field of Classification Search
CPC ... H03F 2200/451; H03F 3/193; H03F 3/211; H03F 1/0277; H03F 3/19; H03F 1/0205; H03F 1/565; H03F 2200/294; H03F 2203/211; H03F 3/005; H03F 3/187; H03F 3/213; H03F 3/2171; H03F 3/2178
USPC ........................................ 330/51, 124 R, 295
See application file for complete search history.

(56) References Cited

U.S. PATENT DOCUMENTS 5,541,554 A *  7/1996  Stengel et al. .................. 330/51
7,486,133 B2 *  2/2009  Bakalski ......................... 330/51
8,519,795 B2 *  8/2013  Watanabe et al. ............... 330/51
8,564,366 B2 * 10/2013  Namie et al. .................... 330/51
8,614,601 B2 * 12/2013  Ota et al. ........................ 330/51

FOREIGN PATENT DOCUMENTS

JP    2002-185270 A    6/2002

* cited by examiner

*Primary Examiner* — Khanh V Nguyen
(74) *Attorney, Agent, or Firm* — Leydig, Voit & Mayer, Ltd.

(57) ABSTRACT

A first amplifier is connected between an input terminal and an output terminal. A first junction point is located between the input terminal and an input of the first amplifier. A second junction point is located between the output terminal and an output of the first amplifier. A second amplifier is connected in parallel with the first amplifier, between the first junction point and the second junction point. A third junction point is located between an output of the second amplifier and the second junction point. A first capacitor and a switch are connected in series between the third junction point and ground. The second junction point is the lowest impedance point along a power amplification path that includes the input terminal, the first amplifier, and the output terminal. The switch is turned off/on when the second/first amplifier is turned on.

6 Claims, 4 Drawing Sheets

POWER AMPLIFIER

BACKGROUND OF THE INVENTION

1. Field of the Invention

The present invention relates to a power amplifier for use in wireless devices such as mobile terminals.

2. Background Art

Power amplifiers typically have a function to switch between two or more power amplification paths therein so as to achieve high power load efficiency over the entire power range. A high frequency switch is inserted in series with the output side of each power amplification path in order to isolate the transistors in one path from those in other paths and thereby prevent each transistor from being subjected to unwanted voltages when the transistor is turned off.

Further, some power amplifiers are configured such a manner that a high frequency switch is connected between the output side of one of the power amplification paths and ground (a shunt configuration), and that power amplification path is fully short-circuited to ground by the high frequency switch when the high frequency switch is turned on, thereby controlling the impedance of the power amplification path (see, e.g., Japanese Laid-Open Patent Publication No. 2002-185270).

SUMMARY OF THE INVENTION

In the case of a power amplifier in which a high frequency switch is inserted in series with the output side of a power amplification path, the loss in the high frequency switch serves to reduce the power load efficiency of the power amplifier. This means that since high frequency switches formed of Si material have relatively high power loss, it is difficult to design a power amplifier of Si material in which a high frequency switch is inserted in series with a power amplification path. Further, reducing the power loss of a high frequency switch (e.g., of Si material) requires increasing its size, making it difficult to reduce the size of the power amplifier.

On the other hand, power amplifiers in which a high frequency switch is connected between the output side of a power amplification path and ground are disadvantageous in that it is necessary to prevent a DC current from flowing through the high frequency switch when the high frequency switch is turned on. Further, the matching circuits of the power amplifier must be configured so as to prevent high frequency signals in the transmission frequency range of the power amplifier from entering the short circuit formed by the high frequency switch. This may put a restriction on the design of the matching circuit for the power amplification path to which the high frequency switch is connected.

The present invention has been made to solve the above problems. It is, therefore, an object of the present invention to provide a power amplifier which exhibits a reduced circuit loss while maintaining isolation between two power amplification paths therein.

According to the present invention, a power amplifier comprises: an input terminal; an output terminal; a first amplifier connected between the input terminal and the output terminal; a first junction point located between the input terminal and an input of the first amplifier; a second junction point located between the output terminal and an output of the first amplifier; a second amplifier connected between the first junction point and the second junction point and connected in parallel with the first amplifier; a third junction point located between an output of the second amplifier and the second junction point; a first capacitor connected between the third junction point and ground; and a switch connected between the third junction point and ground and connected in series with the first capacitor, wherein the second junction point is selected to be the lowest impedance point along a power amplification path that includes the input terminal, the first amplifier, and the output terminal, the switch is turned off when the second amplifier is turned on, and the switch is turned on when the first amplifier is turned on.

The present invention makes it possible to provide a power amplifier which exhibits a reduced circuit loss while maintaining isolation between two power amplification paths therein.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
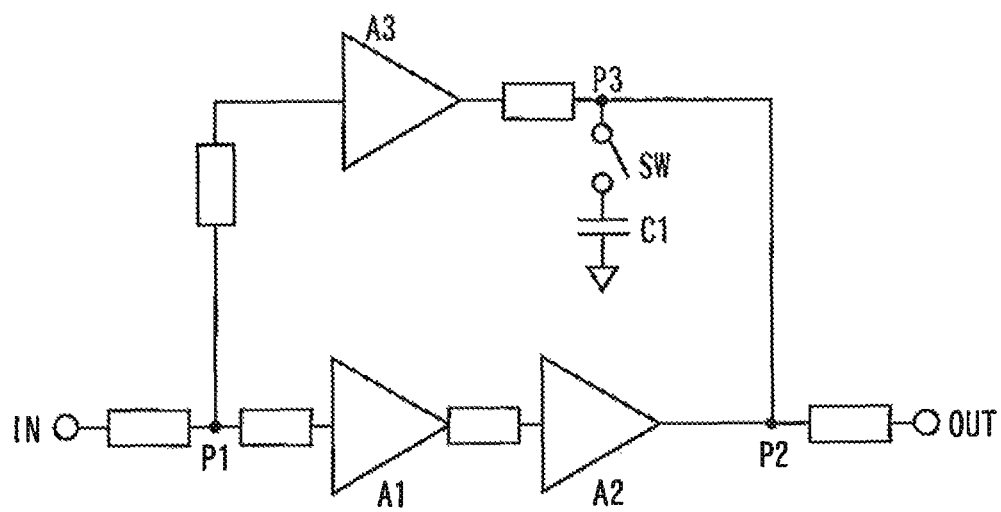
FIG. 1 is a diagram showing a power amplifier in accordance with a first embodiment of the present invention.

FIG. 1 is a diagram showing a power amplifier in accordance with a first embodiment of the present invention. Amplifiers A1 and A2 are connected in series between an input terminal IN and an output terminal OUT. A junction point P1 is located between the input terminal IN and the input of the amplifier A1. A junction point P2 is located between the output terminal OUT and the output of the amplifier A2. The junction point P2 is selected to be the lowest impedance point along the power amplification path that includes the input terminal IN, the amplifiers A1 and A2, and the output terminal OUT, connected in series in that order. (The lowest impedance point may be, e.g., the collector terminal, or drain terminal, of the amplifier A2.)

An amplifier A3 is connected between the junction points P1 and P2; that is, the amplifier A3 is connected in parallel with the series connection of the amplifiers A1 and A2. The output power of the amplifier A3 is lower than those of the amplifiers A1 and A2. A junction point P3 is located between the output of the amplifier A3 and the junction point P2. A switch SW is connected at one end to the junction point P3 and at the other end to one end of a capacitor C1. The other end of the capacitor C1 is connected to ground.

The capacitor C1 and the switch SW together form a shunt high frequency switch circuit, one end of which is connected to junction point P3 and the other end of which is connected to ground. The switch SW is turned off when the amplifier A3 is turned on, and the switch SW is turned on when the amplifiers A1 and A2 are turned on. Thus, either the power amplification path including the amplifiers A1 and A2 or the power amplification path including the amplifier A3 is used depending on the required output power level, and the switch SW is turned on when the power amplification path including the amplifier A3 is not used.

The capacitance value of the capacitor C1 is selected to be sufficiently high relative to the transmission frequency range and such that the reflection coefficient on the Smith chart which corresponds to the impedance of the power amplification path including the amplifier A3, as seen from the junction point P2, has a phase angle of −90 to 90 degrees when the switch SW is turned on. As a result, the impedance of that power amplification path, as seen from the junction point P2, is substantially infinite (as if the power amplification path were disconnected from the junction point P2) when the switch SW is turned on.

Since the shunt high frequency switch SW is connected between the junction point P3 and ground, this power amplifier exhibits a lower circuit loss than power amplifiers in which a high frequency switch is inserted in series with a power amplification path. Further, since the power amplification path including the amplifier A3 is connected to the lowest impedance point along the power amplification path including the amplifiers A1 and A2, high frequency signals in the transmission frequency range of the power amplifier are prevented from entering the shunt high frequency switch circuit even when the high frequency switch SW is turned on and hence the junction point P3 is short-circuited to ground through the capacitor C1. This results in reduced loss in the entire circuit of the power amplifier. The capacitor C1 prevents a DC current from flowing through the shunt high frequency switch circuit to ground. Further, since the capacitance value of the capacitor C1 is sufficiently high relative to the transmission frequency range, the shunt high frequency switch circuit can provide isolation between the power amplification paths which is comparable to that provided by a series high frequency switch circuit inserted in series with a power amplification path.

Second Embodiment

Figure 2:
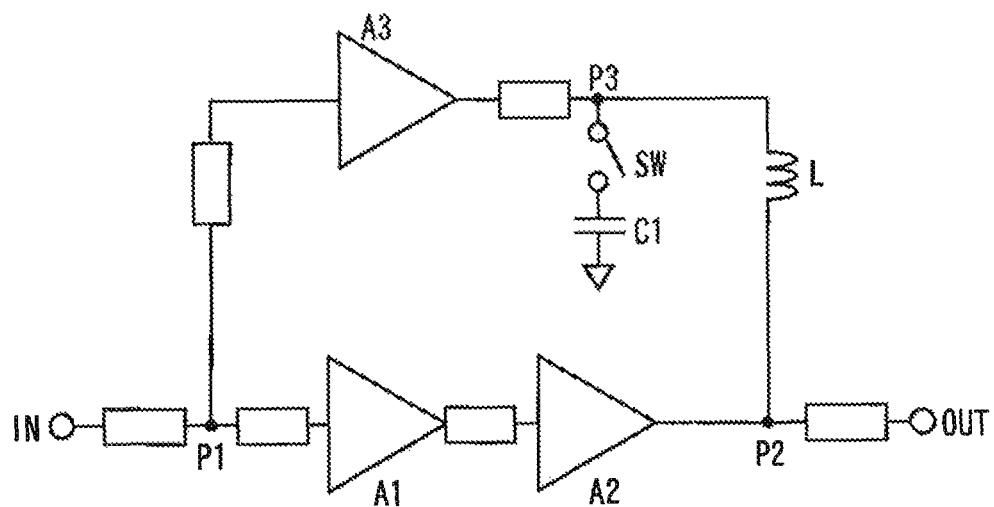
FIG. 2 is a diagram showing a power amplifier in accordance with a second embodiment of the present invention.

FIG. 2 is a diagram showing a power amplifier in accordance with a second embodiment of the present invention. An inductor L is connected between the output of the amplifier A3 and the junction point P2 located on the power amplification path including the amplifiers A1 and A2. This series inductor L serves to increase the Q value of the shunt high frequency switch circuit including the capacitor C1. This makes it possible to reduce the capacitance value of the capacitor C1 and thereby reduce the layout area. Further, the increased Q value means that the impedance of the power amplification path to which the shunt high frequency switch circuit is connected, as seen from the junction point P2, is substantially infinite (as if the power amplification path were disconnected from the junction point P2), making it possible to enhance isolation between the power amplification paths of the power amplifier.

Third Embodiment

Figure 3:
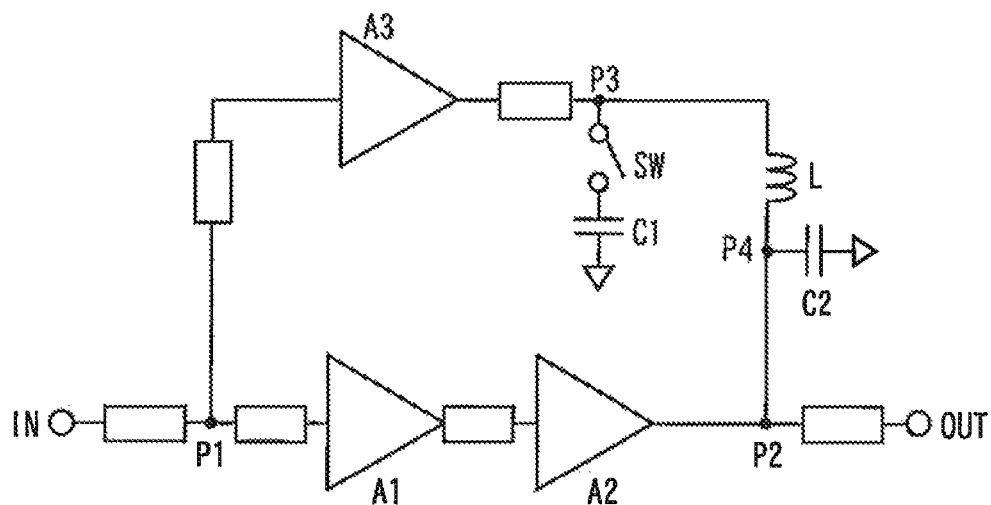
FIG. 3 is a diagram showing a power amplifier in accordance with a third embodiment of the present invention.

FIG. 3 is a diagram showing a power amplifier in accordance with a third embodiment of the present invention. A junction point P4 is located between the output of the amplifier A3 and the junction point P2. A capacitor C2 is connected between the junction point P4 and ground. Other than this feature, the power amplifier of the third embodiment is identical in construction to the power amplifier of the second embodiment. The amplifier A3 has a different optimum output impedance than the amplifiers A1 and A2. Therefore, for example, when the output of the amplifier A3 is connected to the same load to which the amplifier A2 is connected, the output impedance of the amplifier A3 must be converted to match that of the amplifier A2. Such conversion is provided by the LC circuit consisting of the series inductor L and the shunt capacitor C2 and inserted between the junction points P2 and P3. A plurality of conversion circuits (or LC circuits) may be connected in series to reduce impedance conversion loss and thereby further reduce circuit loss.

Fourth Embodiment

Figure 4:
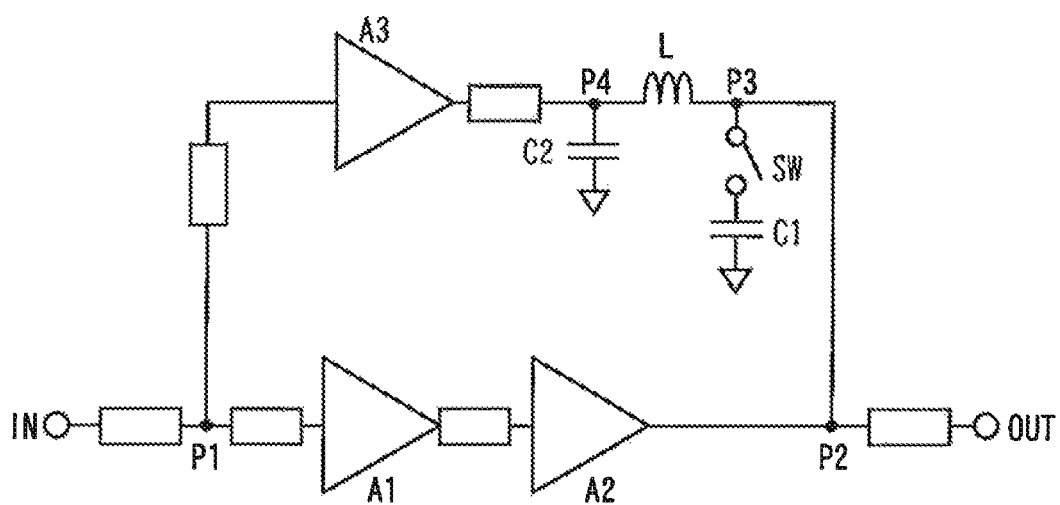
FIG. 4 is a diagram showing a power amplifier in accordance with a fourth embodiment of the present invention.

FIG. 4 is a diagram showing a power amplifier in accordance with a fourth embodiment of the present invention. This power amplifier differs from that of the third embodiment in that the series inductor L and the shunt capacitor C2 are connected between the output of the amplifier A3 and the shunt high frequency switch circuit, as shown in FIG. 4. This LC circuit also provides impedance conversion, meaning that the fourth embodiment has the same advantages as described above in connection with the third embodiment.

Fifth Embodiment

Figure 5:
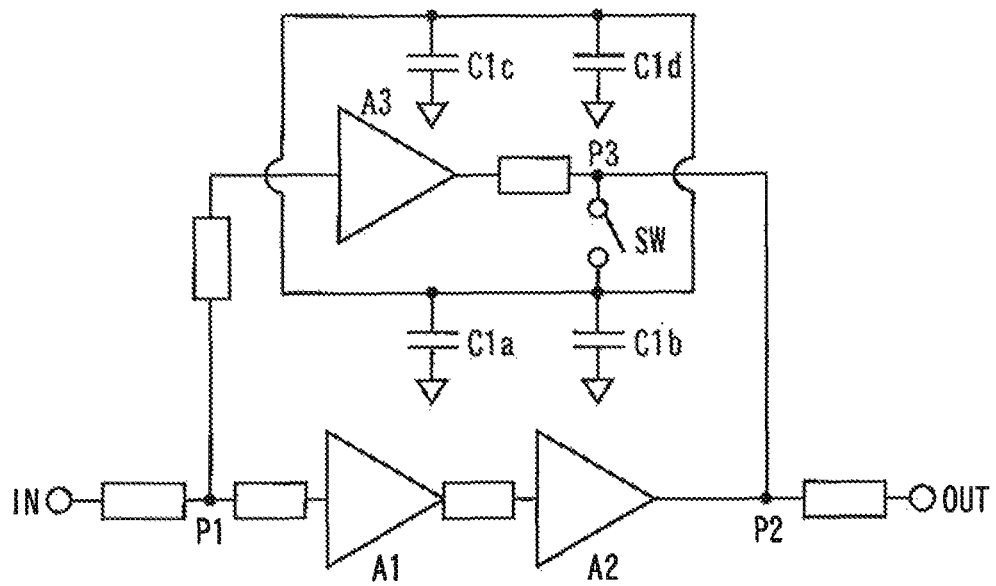
FIG. 5 is a diagram showing a power amplifier in accordance with a fifth embodiment of the present invention.

FIG. 5 is a diagram showing a power amplifier in accordance with a fifth embodiment of the present invention. This power amplifier differs from that of the first embodiment in that the capacitor C1 is replaced by a plurality of parallel connected capacitors C1a to C1d disposed around the amplifier A3. This configuration prevents the high frequency signal amplified by the amplifiers A1 and A2 from entering the amplifier A3, as well as preventing the high frequency signal amplified by the amplifier A3 from entering the power amplification path including the amplifiers A1 and A2, thereby enhancing isolation between the power amplification path including the amplifiers A1 and A2 and the power amplification path including the amplifier A3.

Sixth Embodiment

Figure 6:
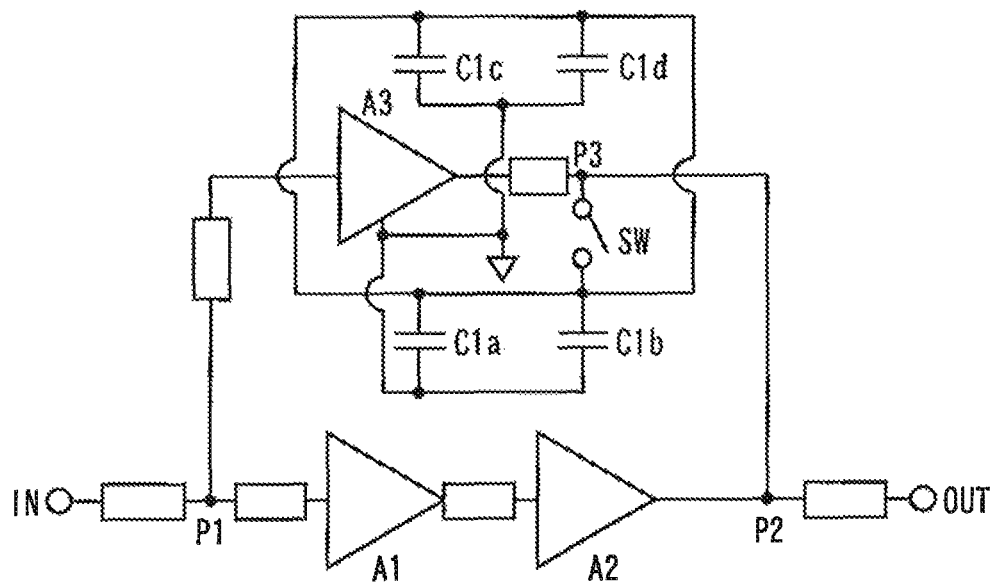
FIG. 6 is a diagram showing a power amplifier in accordance with a sixth embodiment of the present invention.

FIG. 6 is a diagram showing a power amplifier in accordance with a sixth embodiment of the present invention. It should be noted that two spaced apart grounding conductors for high frequency signals may not be at equal ground potentials due to a slight inductive component, causing high frequency signals to leak into unintended paths through grounding conductors. The power amplifier of the sixth embodiment is configured to avoid this problem and differs from the power amplifier of the fifth embodiment in that the capacitors C1a to C1d of the shunt high frequency switch circuit and the amplifier A3 are grounded to a common ground. This reduces high frequency signals leaking into other paths through grounding conductors, making it possible to enhance isolation between the power amplification path including the amplifiers A1 and A2 and the power amplification path including the amplifier A3.

Seventh Embodiment

Figure 7:
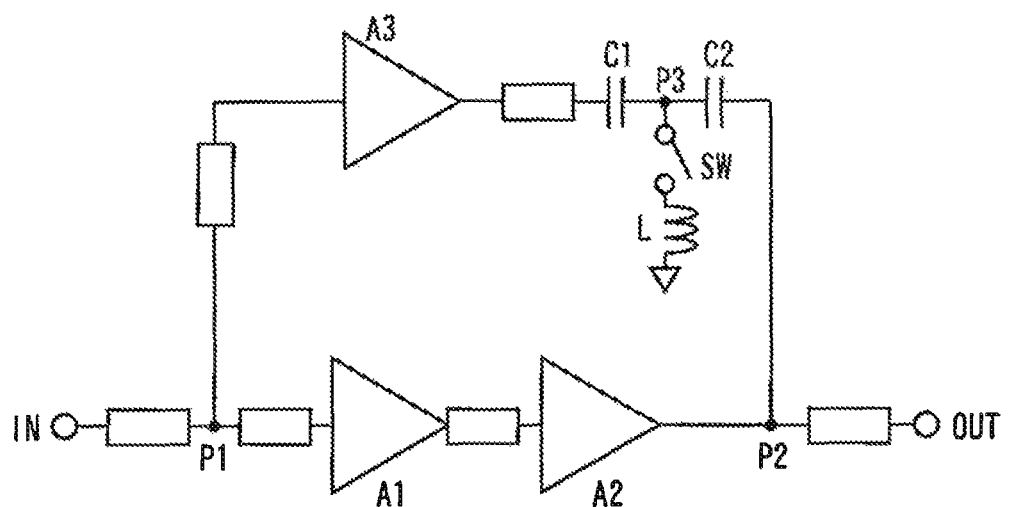
FIG. 7 is a diagram showing a power amplifier in accordance with a seventh embodiment of the present invention.

FIG. 7 is a diagram showing a power amplifier in accordance with a seventh embodiment of the present invention.

This power amplifier is similar to that of the first embodiment, except that the shunt high frequency switch circuit has a different configuration. Capacitors C1 and C2 are connected in series between the output of the amplifier A3 and the junction point P2. A junction point P3 is located between the capacitors C1 and C2. A switch SW is connected at one end to the junction point P3 and at the other end to one end of an inductor L. The other end of the inductor L is connected to ground.

Whereas the shunt high frequency switch circuit of the first embodiment includes the switch SW and one capacitor, the shunt high frequency switch circuit of the present embodiment includes the switch SW, two series connected capacitors, and an inductor connected to the junction between these capacitors. The shunt high frequency switch circuit of the present embodiment can also provide the same advantages as described above in connection with the first embodiment. However, the inductance value of the inductor L and the capacitance values of the series connected capacitors C1 and C2 must be such that the reflection coefficient on the Smith chart which corresponds to the impedance of the power amplification path including the amplifier A3, as seen from the junction point P2, has a phase angle of −90 to 90 degrees when the shunt high frequency switch circuit is turned on.

It should be noted that the high frequency switch SW may be configured using an FET/HEMT, MEMS, or diode, etc. Further, although the present invention has been described in connection with power amplifiers having two power amplification paths, it is to be understood that the present invention may be applied to power amplifiers having three or more power amplification paths. It should be further noted that in the power amplifier of each of the above embodiments a high frequency switch is connected between one of the two power amplification paths and ground so as to isolate these power amplification paths from each other in terms of high frequency signals. This means that a DC current can still flow between the power amplification paths. Therefore, it is not necessary to separate the power supply path even if a capacitor is not connected in series between the power source and active devices such as transistors.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-277202, filed on Dec. 19, 2012, including specification, claims, drawings, and summary, on which the Convention priority of the present application is based, is incorporated herein by reference in its entirety.

What is claimed is:

1. A power amplifier comprising:
an input terminal;
an output terminal;
a first amplifier connected between the input terminal and the output terminal;
a first junction point located between the input terminal and an input of the first amplifier;
a second junction point located between the output terminal and an output of the first amplifier;
a second amplifier connected between the first junction point and the second junction point and connected in parallel with the first amplifier;
a third junction point located between an output of the second amplifier and the second junction point;
a first capacitor connected between the third junction point and ground; and
a switch connected between the third junction point and ground and connected in series with the first capacitor, wherein
the second junction point is the lowest impedance point along a power amplification path that includes the input terminal, the first amplifier, and the output terminal,
the switch is turned off when the second amplifier is turned on, and
the switch is turned on when the first amplifier is turned on.

2. The power amplifier according to claim 1, further comprising an inductor connected between an output of the second amplifier and the second junction point.

3. The power amplifier according to claim 1, wherein the first capacitor includes a plurality of parallel connected capacitors disposed around the second amplifier.

4. The power amplifier according to claim 1, wherein the first capacitor and the second amplifier are grounded to a common ground.

5. A power amplifier comprising:
an input terminal;
an output terminal;
a first amplifier connected between the input terminal and the output terminal;
a first junction point located between the input terminal and an input of the first amplifier;
a second junction point located between the output terminal and an output of the first amplifier;
a second amplifier connected between the first junction point and the second junction point and connected in parallel with the first amplifier;
a third junction point located between an output of the second amplifier and the second junction point;
a first capacitor connected between the third junction point and ground;
a switch connected between the third junction point and ground and connected in series with the first capacitor;
a fourth junction point located between an output of the second amplifier and the second junction point; and
a second capacitor connected between the fourth junction point and ground, wherein
the second junction point is the lowest impedance point along a power amplification path that includes the input terminal, the first amplifier, and the output terminal,
the switch is turned off when the second amplifier is turned on, and
the switch is turned on when the first amplifier is turned on.

6. A power amplifier comprising:
an input terminal;
an output terminal;
a first amplifier connected between the input terminal and the output terminal;
a first junction point located between the input terminal and an input of the first amplifier;
a second junction point located between the output terminal and an output of the first amplifier;
a second amplifier connected between the first junction point and the second junction point;
first and second capacitors connected in series between an output of the second amplifier and the second junction point;
a third junction point located between the first capacitor and the second capacitor;

an inductor connected between the third junction point and ground; and a switch connected between the third junction point and ground and connected in series with the inductor, wherein the second junction point is the lowest impedance point along a power amplification path that includes the input terminal, the first amplifier, and the output terminal, the switch is turned off when the second amplifier is turned on, and the switch is turned on when the first amplifier is turned on.

* * * * *